United States Patent
Misra et al.

(10) Patent No.: US 7,705,613 B2
(45) Date of Patent: Apr. 27, 2010

(54) SENSITIVITY CAPACITIVE SENSOR

(76) Inventors: Abhay Misra, 571 Polo Club Dr., Austin, TX (US) 78737; John Trezza, 12 White Oak Dr., Nashua, NH (US) 03063

( * ) Notice: Subject to any disclaimer, the term of this patent is extended or adjusted under 35 U.S.C. 154(b) by 177 days.

(21) Appl. No.: 11/619,482

(22) Filed: Jan. 3, 2007

(65) Prior Publication Data
US 2008/0157787 A1  Jul. 3, 2008

(51) Int. Cl.
G01R 27/26 (2006.01)
G06K 9/00 (2006.01)

(52) U.S. Cl. .................. 324/662; 324/686; 382/116; 382/124

(58) Field of Classification Search .......... 324/662, 324/661, 658, 649, 600, 686, 76.11, 158.1; 382/116, 115, 124, 126
See application file for complete search history.

(56) References Cited

U.S. PATENT DOCUMENTS

| | | | |
|---|---|---|---|
| 5,100,480 A | 3/1992 | Hayafuji | |
| 5,220,530 A | 6/1993 | Itoh | |
| 5,447,076 A | 9/1995 | Ziegler | |
| 5,563,084 A | 10/1996 | Ramm et al. | |
| 5,587,119 A | 12/1996 | White | |
| 5,708,569 A | 1/1998 | Howard et al. | |
| 5,814,889 A | 9/1998 | Gaul | |
| 5,872,338 A | 2/1999 | Lan et al. | |
| 5,929,524 A | 7/1999 | Drynan et al. | |
| 5,962,922 A | 10/1999 | Wang | |
| 6,011,859 A | 1/2000 | Kalnitsky et al. | |
| 6,037,665 A | 3/2000 | Miyazaki | |
| 6,184,066 B1 | 2/2001 | Chino et al. | |
| 6,215,114 B1 | 4/2001 | Yagi et al. | |
| 6,314,013 B1 | 11/2001 | Ahn et al. | |
| 6,316,737 B1 | 11/2001 | Evans et al. | |
| 6,429,666 B1 * | 8/2002 | Um ........................ 324/693 |
| 6,498,089 B2 | 12/2002 | Komada | |

(Continued)

FOREIGN PATENT DOCUMENTS

EP    0 516 866    12/1992

(Continued)

OTHER PUBLICATIONS

Tartagni, Marco and Guerrieri, Roberto, "A Fingerprint Sensor Based on the Feedback Capacitive Sensing Scheme," *IEEE Journal of Solid State Circuits*, pp. 1-8, 1997.

(Continued)

*Primary Examiner*—Hoai-An D Nguyen

(57) ABSTRACT

A method of creating an improved sensitivity capacitive fingerprint sensor involves forming vias from a first side of a sensor chip having an array of capacitive sensors, making the vias electrically conductive, and attaching a cover plate over the first side of the sensor chip spaced from the sensor chip by a distance of less than 25 μm. An improved sensitivity capacitive fingerprint sensor has a capacitive sensor array including multiple sensor cells and electrically conductive, through-chip vias extending from connection points for sensor cell circuitry to a back side of the capacitive sensor array, a chip including active detection circuitry and electrical connection points, the electrical connection points being respectively connected to corresponding ones of the sensor cell circuitry connection points, and a cover plate, disposed above the sensor cells at a spacing of less than 25 μm.

14 Claims, 5 Drawing Sheets

U.S. PATENT DOCUMENTS

| | | | |
|---|---|---|---|
| 6,559,540 | B2 | 5/2003 | Kawashima |
| 6,577,013 | B1 | 6/2003 | Glenn et al. |
| 6,578,436 | B1 | 6/2003 | Ganapathi et al. |
| 6,599,778 | B2 | 7/2003 | Pogge et al. |
| 6,706,554 | B2 | 3/2004 | Ogura |
| 6,740,576 | B1 | 5/2004 | Lin et al. |
| 6,746,953 | B2 | 6/2004 | Kramer et al. |
| 6,844,744 | B2 * | 1/2005 | Ishii et al. .................... 324/686 |
| 6,939,789 | B2 | 9/2005 | Huang et al. |
| 7,126,349 | B2 * | 10/2006 | Hara ........................... 324/658 |
| 7,157,310 | B2 | 1/2007 | Benson et al. |
| 7,208,961 | B2 * | 4/2007 | Miyasaka ................... 324/686 |
| 2001/0001292 | A1 | 5/2001 | Bertin et al. |
| 2001/0033509 | A1 | 10/2001 | Ahn et al. |
| 2001/0048166 | A1 | 12/2001 | Miyazaki |
| 2002/0053726 | A1 | 5/2002 | Mikubo et al. |
| 2002/0102835 | A1 | 8/2002 | Stucchi et al. |
| 2003/0047799 | A1 | 3/2003 | Cheever et al. |
| 2003/0052324 | A1 | 3/2003 | Kimura |
| 2003/0161512 | A1 * | 8/2003 | Mathiassen et al. ......... 382/124 |
| 2003/0222659 | A1 * | 12/2003 | Miyasaka ................... 324/661 |
| 2004/0070407 | A1 * | 4/2004 | Fang et al. .................. 324/662 |
| 2004/0130335 | A1 * | 7/2004 | Shimizu et al. ............. 324/661 |
| 2004/0207061 | A1 | 10/2004 | Farrar et al. |
| 2004/0262635 | A1 | 12/2004 | Lee |
| 2005/0104027 | A1 | 5/2005 | Lazarev |
| 2005/0104219 | A1 | 5/2005 | Matsui |
| 2005/0121768 | A1 | 6/2005 | Edelstein et al. |
| 2005/0146049 | A1 | 7/2005 | Kripesh et al. |
| 2005/0180609 | A1 * | 8/2005 | Bolis et al. .................. 382/116 |
| 2006/0066572 | A1 * | 3/2006 | Yumoto et al. .............. 345/157 |

FOREIGN PATENT DOCUMENTS

| | | | |
|---|---|---|---|
| EP | | 1 415 950 | 5/2004 |

OTHER PUBLICATIONS

Tartagni, Marco and Guerrieri, Roberto, "A 390 dpi Live Fingerprint Imager Based on Feedback Capacitive Sensing Scheme," *ISSCC*—Paper 12.3, pp. 1-3, 1997.

International Search Report for PCT/US06/23364, dated Nov. 13, 2006.

Topol, A.W. et al., "Enabling Technologies for Wafer-Level Bonding of 3D MEMS and Integrated Circuit Structures", Electronic Components and Technology Conference, 2004, vol. I, Jun. 1-4, 2004, pp. 931-938.

International Search Report, PCT/US06/23361, dated Sep. 19, 2007.

International Search Report and Written Opinion for PCT/US2007/089051 mailed on Sep. 19, 2008.

International Search Report for PCT/US06/23366, dated Dec. 8, 2006.

Copy of International Preliminary Report on Patentability for PCT/US2007/089051 mailed Jul. 16, 2009.

* cited by examiner though this description is simplified for FIG. 1, ~50 μm. As illustrated in FIG. 1 and noted above, each cell 102a, 102b corresponds to a pixel and includes two conductor plates 104a, 104b, covered with an insulating layer 106 which acts as a capacitor dielectric.

SENSITIVITY CAPACITIVE SENSOR

FIELD OF THE INVENTION

This invention relates to capacitive sensors and, more particularly, to capacitive sensors for use in fingerprint detection.

BACKGROUND

Fingerprints have long been used for authentication purposes. While originally done for purposes of criminal investigation, in the electronic age, fingerprint detection has become a prevalent form of identification for, among others, security purposes. In such cases, the fingerprint pattern must be discerned and verified. In order to discern the particular fingerprint, fingerprint sensors are used to, in effect, generate a digital picture of the ridges and valleys that form the loops and whorls on a finger surface. This is done by having an array of cells, in which each corresponds to a single pixel of the fingerprint image. There are different types of sensors for doing so and their resolution is on the order of about 350 to 512 dpi, although higher pixel resolutions can be found. In order to accomplish the foregoing, capacitive sensors are commonly used.

One type of capacitive sensor uses one electrode for each pixel. The electrode measures the capacity relative to a neighbor electrode with the capacitance being different if a pixel is on a groove or on a ridge. Another type of capacitive sensor is similar to the previous one, except that capacitance is measured between the pixel and ground. Yet another type, more indicative of typical commercial systems, involves some combination of these two types. With still other types of capacitive sensors, the capacitance is measured using AC voltage on an inter-electrode and/or electrode to ground basis.

In some cases, the forgoing types of sensors can be used in a scanner-like configuration to obtain an image of the fingerprint using electrical current instead of light.

By way of background, FIG. 1 illustrates a simplified example of a portion 100 of a simple capacitive sensor. The sensor is made up of one or more semiconductor chips containing an array of individual cells 102a, 102b that are each smaller than the width of one ridge or valley on a finger, in the simplified example of FIG. 1, ~50 μm. As illustrated in FIG. 1 and noted above, each cell 102a, 102b corresponds to a pixel and includes two conductor plates 104a, 104b, covered with an insulating layer 106 which acts as a capacitor dielectric.

The sensor is connected to an integrator that includes an inverting operational amplifier 108. The inverting amplifier 108 alters one current based on fluctuations in another current. Specifically, the inverting amplifier alters a supply voltage. The alteration is based on the relative voltage of two inputs, called the inverting terminal 110 and the non-inverting terminal 112. In this case, the non-inverting terminal is connected to ground, and the inverting terminal is connected to a reference voltage supply 114 and a feedback loop 116. The feedback loop 116, which is also connected to the amplifier output 118, includes the two conductor plates 104a, 104b. The two conductor plates 104a, 104b form a capacitor. The surface of the finger acts as a third capacitor plate and is separated from the two conductor palates by at least the insulating layer 106.

Since varying the distance between the capacitor plates changes the total capacitance of the capacitor, a greater capacitance will indicate a ridge 120 and a lesser capacitance will indicate a valley 122 (because of the air located in the valley) and thus, a ridge 120 will result in a different output signal from the cell than will result from the presence of a valley 122.

FIG. 2 illustrates, in overly simplified form, a top view of a capacitive sensor array 200 incorporating cells 202 such as, for example, those of FIG. 1 or some other cell design.

Each cell is typically addressed in a known manner, whether in parallel, in series, or some combination of the two (i.e. a scan), to obtain the image and, in some cases, to perform more complex operations like sub sampling. The output is provided to a analog signal processing circuitry (to allow for adjustment of gain and offset) and then to an A/D converter to convert the analog values to digital values. The digital values can then be processed as needed by, for example, an appropriately programmed microprocessor.

It should be appreciated that the above is somewhat overly simplified but conveys the general approach, the design, development and use of capacitive sensors, per se, being known and thus need not be elaborated on in greater detail for an understanding of the concepts described herein.

Ideally, for the best resolution, the sensor will be able to have direct contact with the finger to be read. However, in order to prevent damaging the sensor arra from pressure, repeated usage or foreign substances that might be present in the vicinity or on a finger, a cover plate is placed over the sensor. This cover plate is typically glass and of sufficient thickness to resist the pressures of at least normal use and sufficient durability to allow for cleaning when necessary. However, the cover plate also increases the distance between the sensor plates and the finger, thereby reducing the sensitivity—and thus, accuracy—of the sensor. This is because, as should be evident from the above, the further the distance between the cover plate surface and the sensor, relative to the distance between the top of a ridge and the bottom of a valley, the more difficult it becomes to discriminate between ridges and valleys.

Thus, there is a need in the art for an improved capacitive fingerprint sensor that allows for use of a sufficiently strong and durable cover plate while also allowing for detection of the ridges and valleys needed for accurate fingerprint capture.

SUMMARY OF THE INVENTION

We have realized creation of an improved sensitivity capacitive fingerprint sensor.

One aspect of the improved sensitivity capacitive fingerprint sensor involves forming vias from a first side of a sensor chip having an array of capacitive sensors, making the vias electrically conductive, and attaching a cover plate over the first side of the sensor chip spaced from the sensor chip by a distance of less than 25 μm.

Another aspect of the improved sensitivity capacitive fingerprint sensor involves a capacitive sensor array chip including multiple sensor cells and electrically conductive, through-chip vias extending from connection points for sensor cell circuitry to a back side of the capacitive sensor array chip, a chip including active detection circuitry and electrical connection points, the electrical connection points being respectively connected to corresponding ones of the sensor cell circuitry connection points, and a cover plate, disposed above the sensor cells at a spacing of less than 25 μm.

The advantages and features described herein are a few of the many advantages and features available from representative embodiments and are presented only to assist in understanding the invention. It should be understood that they are not to be considered limitations on the invention as defined by the claims, or limitations on equivalents to the claims. For instance, some of these advantages are mutually contradictory, in that they cannot be simultaneously present in a single embodiment. Similarly, some advantages are applicable to one aspect of the invention, and inapplicable to others. Thus, this summary of features and advantages should not be considered dispositive in determining equivalence. Additional features and advantages of the invention will become apparent in the following description, from the drawings, and from the claims.

DETAILED DESCRIPTION

Figure 1:
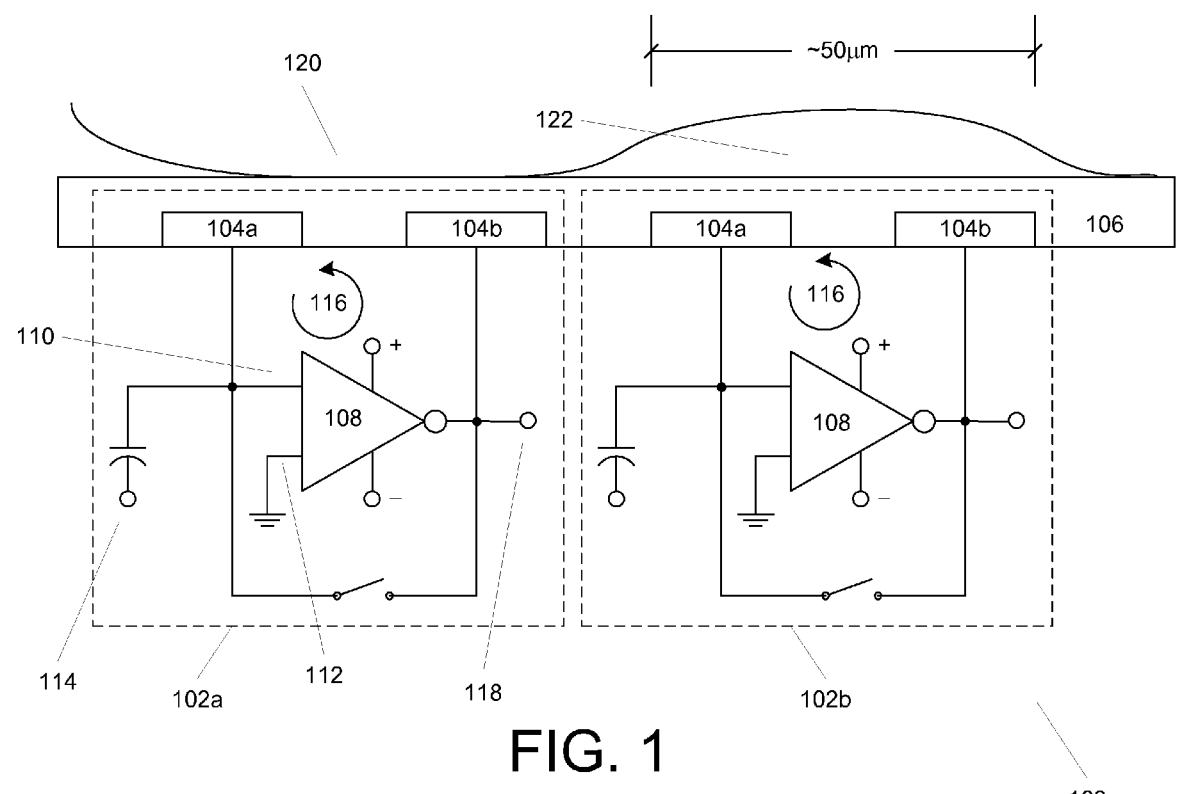
FIG. 1 illustrates a simplified example of a portion 100 of a simple capacitive sensor.
Figure 2:
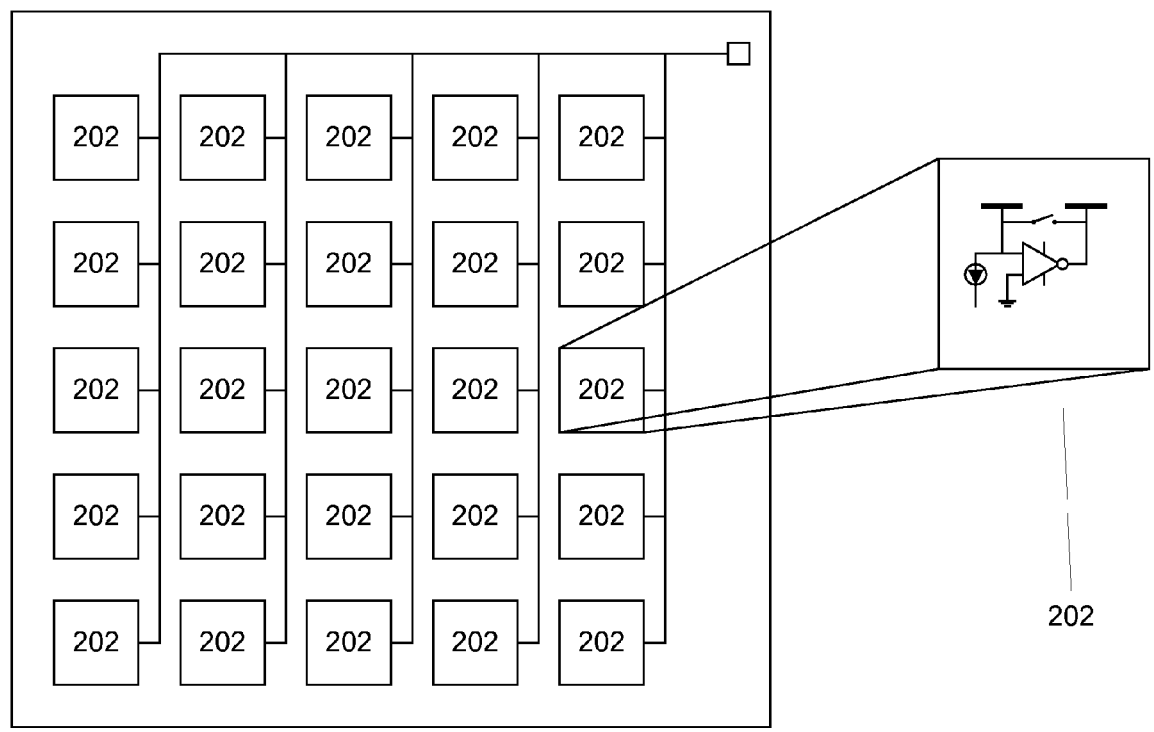
FIG. 2 illustrates, in overly simplified form, a top view of a capacitive sensor array incorporating cells.
Figure 3:
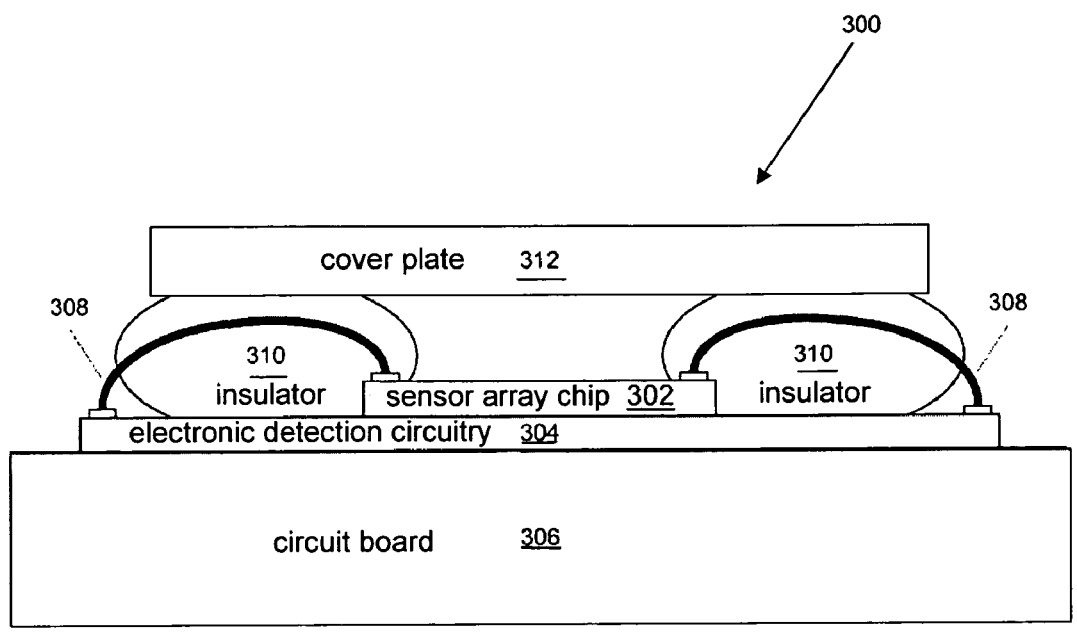
FIG. 3 illustrates, in simplified form, a side view of a portion 300 of a typical capacitive fingerprint sensor device of the prior art.

FIG. 3 illustrates, in simplified form, a side view of a portion 300 of a typical capacitive fingerprint sensor device of the prior art. As shown in FIG. 3, the device is made up of a capacitive sensor array chip 302 (an array of individual pixel cells such as previously described), active electronic detection circuitry 304 that is used to, for example, access and receive the individual pixel values from the capacitive sensor array chip 302, a circuit board 306 to which the active electronic detection circuitry 304 is electronically connected and physically mounted, and, although not shown, a processor which can be used to analyze the pixel values as necessary for the desired application. The capacitive sensor array chip 302 is electrically connected to the active detection circuitry by wirebonds 308, extending from a contact on each to a contact on the other, which have a typical loop height (i.e. from the sensor array chip 302 surface to the top of the wire loop) of between about 75 μm and 125 μm. The wire loops are protected by a material, for example, a nonconductive insulator that also acts to maintain the spacing between the sensors of the sensor array chip 302 and a cover plate 312 positioned over the individual cells of the sensor chip 302. The cover plate 312 is of a material and thickness sufficient to protect the sensors themselves while allowing for the ability to discriminate between a pixel value indicative of a ridge from that of a valley at the distance needed to allow for appropriate clearance, for example about 25 μm, over the wirebond loops. Thus, for current sensor array packages, the cover plate is typically positioned at least 100 μm or more above the cells of the sensor array.

U.S. patent application Ser. Nos. 11/329,481, 11/329,506, 11/329,539, 11/329,540, 11/329,556, 11/329,557, 11/329,558, 11/329,574, 11/329,575, 11/329,576, 11/329,873, 11/329,874, 11/329,875, 11/329,883, 11/329,885, 11/329,886, 11/329,887, 11/329,952, 11/329,953, 11/329,955, 11/330,011 and 11/422,551, all incorporated herein by reference, describe various techniques including, inter alia, for forming small, deep electrically conductive vias in semiconductor wafers, including wafers that already contain fully formed devices, as well as various contact types and processes for using them to form electrical connections. The teachings therein allow for via types, densities and placement that was previously unachievable and can be performed on a chip, die or wafer scale. One of the advantages to the approaches described in those applications is that it allows one to extend a contact from one side of a chip to the opposite side of the chip (with or without rerouting) using such small deep vias. Such techniques allow for high via densities, making it ideal for use with capacitive sensors array chips to eliminate the need to use wirebond connections to connect the capacitive sensor array to the active detection circuitry. As a result, the distance between the cover plate and the sensor array can be reduced significantly. This reduction in distance translates into improved sensitivity and, in some cases, other improvements and advantages such as reduced power consumption, the ability to use lower cost components or design techniques for either the sensor array components themselves or the active detection circuitry, or both. In addition, the capacitive sensor devices can be created on a wafer or chip scale as desired.

The approach can be straightforwardly implemented as follows.

First, the individual capacitive sensors themselves are created in, for example, the conventional manner such that conventional wirebond contact pads are created about the periphery of the area that will become the sensor array chip or, in some implementations, smaller pads are created and/or pads are created at locations on the die other than about the periphery. Then, through-chip vias are created and made electrically conductive using one or more of the approaches described in the applications incorporated by reference above, for example, single conductor, coaxial or even triaxial conductors. Then, optionally, or additionally, one or more of the contact formation techniques can be used to enable the chip to be hybridized to a chip carrying the active device circuitry, if the sensor chip does not, or will not, have the active device circuitry.

Second, a cover plate is optionally attached prior to dicing of the individual chips from the wafer. Advantageously, the cover plate can be placed at the minimum clearance spacing (i.e. directly on the sensors if possible) or at such other desired minimum clearance spacing using, for example, minimal standoffs that can be added to, or formed on, the wafer (again, on a wafer or individual piece basis). In this manner, the spacing between the outer surface of the cover plate and the sensor surface is both greatly reduced and can be more tightly controlled than would have been possible if allowance for wirebond loops was necessary.

Next, the chips, and cover if already attached, can be diced from the wafer for bonding to the active detection circuitry. Alternatively, the chips and cover can be diced separately and attached in a "chip at a time" manner.

Depending upon the particular configurations and chips, a rerouting interposer can also optionally be used to further route the connections from the back side of the sensor chip to the proper locations for joining with the active detection circuitry chip. In such a case, the interposer can be made from any material that can carry electrical connections, from ceramic to plastics to semiconductor materials, the only requirement being the ability to create conductive through-holes and routing patterns on either or both sides. Moreover, where an interposer is used, the interposer can optionally also act as the "package" for the assembly if the sensor chip and active detection circuitry chip are one and the same.

Advantageously, although the use of an interposer increases the overall height, since it is below the sensor chip it does not adversely affect the sensitivity because it does not increase the distance between the cover and sensor array.

Finally, if the sensor chip and the active detection circuitry are not one and the same, the sensor chip and cover plate unit is joined to the active detection circuitry.

Of course, it should go without saying that, with other variants, the sensor chip and the active detection circuitry could be joined and then the cover plate added, there being nothing pertinent to the invention that would require any particular order in that regard.

FIG. 4A illustrates one representative example variant achieved by this approach. As shown in FIG. 4A, the device 400 is made up of a capacitive sensor array chip 402 with conductive through-chip vias 404, such as described above, that extend the contacts 406 of the array chip 402 through to the back side of the array chip 402. A rerouting interposer 408 includes rerouting traces (not shown) in this case on the top and bottom, and its own conductive through-via 410, that bridges the connection between the vias 404 and the contacts 412 on the active detection circuitry chip 414. As above, the active detection circuitry chip 414 will typically itself be attached to a circuit board 416. As can be seen, using this approach, the cover plate 418 can be brought much closer to the sensor array cells than could be done when wirebonds are used. Indeed, using this approach, the spacing between the bottom surface of the cover plate 418 and the highest topographical point on the sensor array chip (as illustrated, the contacts 406 themselves) can be as small as 25 μm or less, and could typically even be 10 μm or less. In fact, in some variants, the distance could be as close to zero as would be allowed by the thickness of whatever adhesive was used to attach the cover plate 418 and/or the likely flexure (if any) of the cover plate 418 itself during use.

It should be noted here that the interposer can employ conductive vias formed as described in the foregoing applications, or formed using more simple processes such as drilling an insulator or plastic sheet and filling the holes with a metal.

FIG. 4B illustrates an alternative variant 400b similar to that of FIG. 4A except that this variant does not use an interposer. Instead, the connection between the vias 404 and the contacts 412 is made up of traces 420 on the surface of the active detection circuitry chip 414 itself, those traces having been made using any suitable known method(s).

Of course, it should be recognized that the detection circuitry chip can also have other circuitry on it. Note further that, in some implementations, the active detection circuitry chip can also function as an interposer or only have part of the active detection circuitry on it such that it must be joined to another chip to provide the full active detection circuitry function. In such cases, the amalgam of the two would be connected to the sensor array chip, and ultimately a package or package chip as desired.

Figure 4:
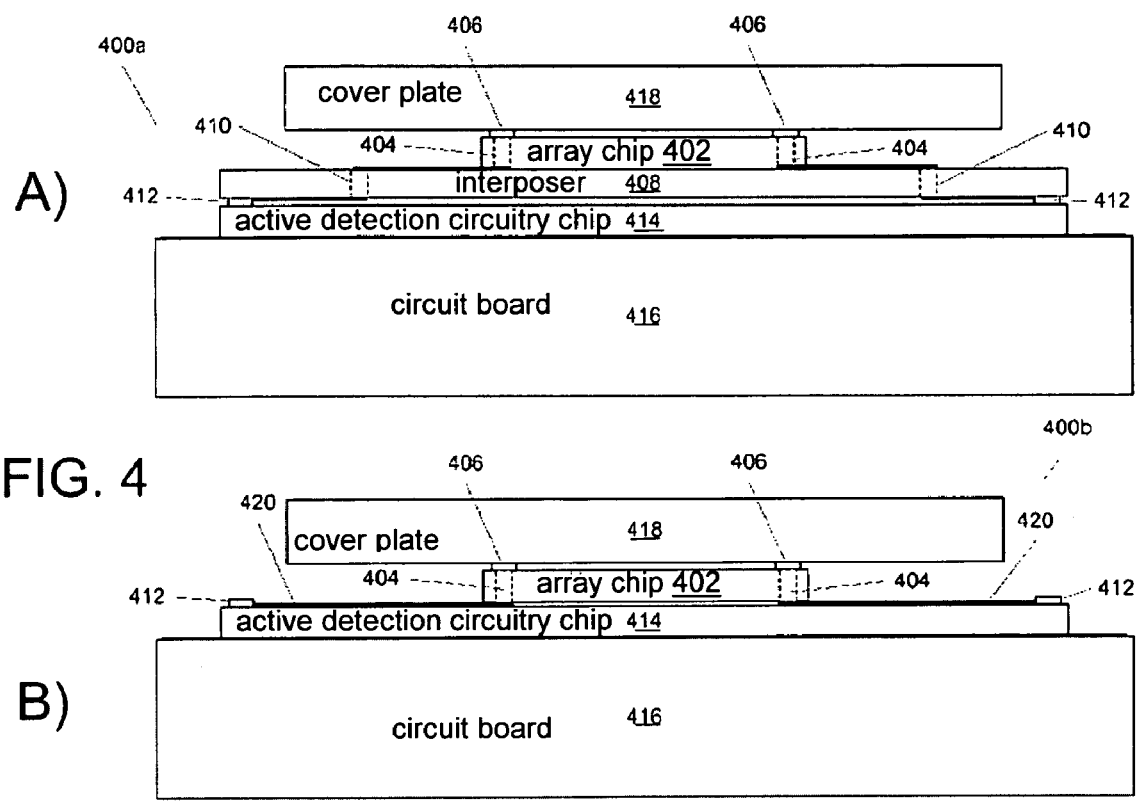
FIG. 4A illustrates one representative example variant.
FIG. 4B illustrates an alternative variant similar to that of FIG. 4A.
Figure 5:
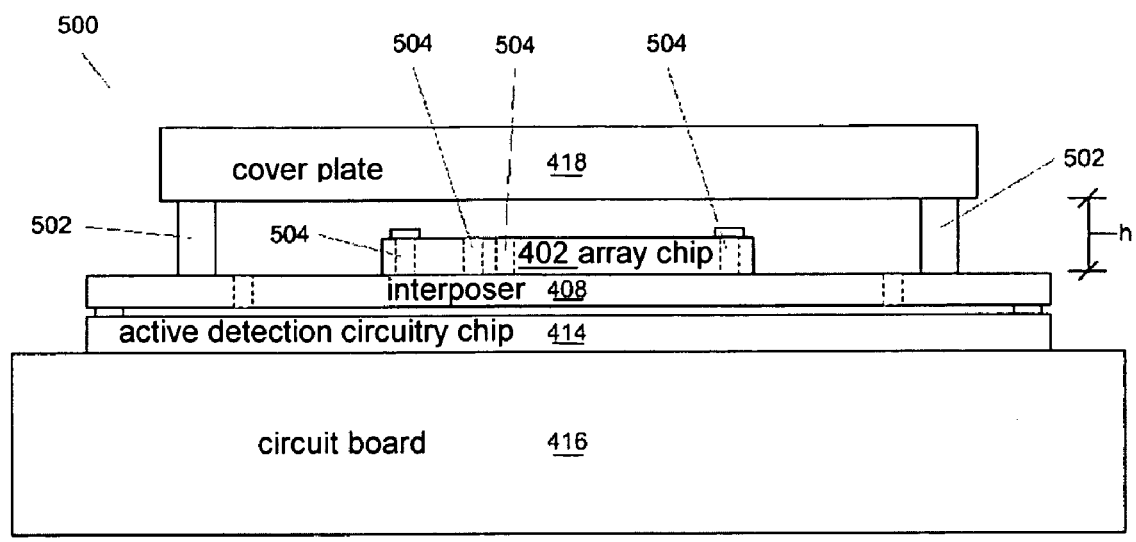
FIG. 5 illustrates yet another alternative variant similar to that of FIG. 4A.

FIG. 5 illustrates yet another alternative variant similar to that of FIG. 4A. In the variant of FIG. 5 however, the cover plate is maintained at a specified distance from the sensor array chip 402 by spacers 502 of a fixed height "h" placed between the interposer 408 and the cover plate 418. Note that, although the variant of FIG. 5 includes an interposer 408, the same approach could be readily translated to the variant of FIG. 4B (i.e. the spacers could rest on the active detection circuitry chip 414 itself) or even to a variant where the spacers 502 rested on the circuit board 416 or some other component (not shown).

It is worth noting that, unlike the chip of FIG. 4, here, the vias 504 are not just located at the periphery of the array chip 402, but rather some vias are located at places within the boundaries of the chip other than at the periphery. Of course, it will be recognized that in yet other variants, all of the vias could be located in places other than at the periphery if desired.

Figure 6:
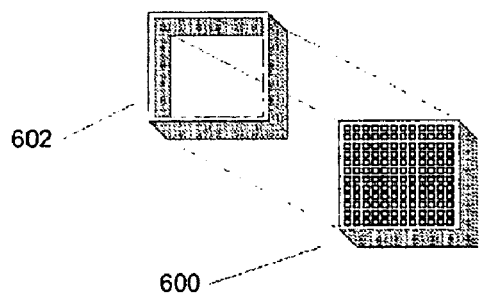
FIG. 6 illustrates a representative spacer for a sensor chip.

In addition, although illustrated as individual spacers 502, the spacers 502 could be fabricated as individual frames such that only one spacer per sensor chip would be needed. Advantageously, such an approach would allow the spacers to also be attached on an individual or collective wafer-like basis by forming multiple frames on a wafer that can be aligned with the sensor chip itself. Still further, as shown in FIG. 6, whether such frames were attached prior to dicing or post dicing, such an approach would allow the frame(s) 602 to be attached to their respective sensor array chips 600 in a manner that forms a hermetic seal about the sensor array chip 600 using, for example, an approach described in the above-incorporated applications, or some other hermetic or non-hermetic approach.

Thus, numerous different approaches and configurations can be created.

The same can be true for the cover plate application. The approach can optionally be performed on a wafer scale basis using a wafer-like element that, post dicing, will become the individual cover plates.

Still further, in an alternative variant, the above process is performed in the manner described (with or without the optional spacers/frames) except, the cover plates are discrete pieces sized to fit an individual sensor chip. In this variant, instead of applying the cover plate on a full wafer basis as above, the individual cover plates can be applied before dicing using conventional "pick-and-place" techniques.

In yet another alternative variant, the chips can be diced from the wafer before the cover plates are applied (i.e. things are done on an individual chip basis, with the cover plate being applied after individual chips have been separated from the wafer).

In any of these approaches, the amalgamated components can also optionally be connected to a package or a package chip as desired.

As should now be appreciated, the above approach is closely tied to use of conventional sensor array and detection circuitry chips. However, the same techniques can be used to greater advantage with chips that have been designed to accommodate one of the via approaches. With such chips, on the sensor side, the high density, small size nature of the via techniques means that vias can be formed directly below each cell, and connect to, the appropriate connection points of the individual pixel cells. In this manner, the sensor chip can be smaller, because the peripheral connection pads are not required. In addition, the sensor chips can be made less complex, because there is no need to route the cells to the periphery. Depending upon the particular design implementation, rerouting of those connections can then be handled on a separate interposer, using backend wafer processing techniques, or such other approaches as desired. Moreover, through use of this approach, if desired, the lengths of the connection runs on the sensor chip can be more easily equalized and the distance between the pixels and the components on the active detection circuitry can be reduced.

Similar benefits can be achieved on the active detection circuitry side as well. Since the connections from the sensor chip can be more concentrated and need not be about the periphery, the corresponding connection points on the active detection circuitry chip can be similarly concentrated and will be more compact. This can free up real estate on the chip that can be used for other purposes.

It should thus be understood that this description (including the figures) is only representative of some illustrative embodiments. For the convenience of the reader, the above description has focused on a representative sample of all possible embodiments, a sample that teaches the principles of the invention. The description has not attempted to exhaustively enumerate all possible variations. That alternate embodiments may not have been presented for a specific portion of the invention, or that further undescribed alternate embodiments may be available for a portion, is not to be considered a disclaimer of those alternate embodiments. One of ordinary skill will appreciate that many of those undescribed embodiments incorporate the same principles of the invention and others are equivalent.

What is claimed is:

1. A fingerprint sensor, comprising:
    a capacitive sensor array including:
        multiple sensor cells;
        sensor cell circuitry having connection points; and
        electrically conductive, though-chip vias extending from the connection points for the sensor cell circuitry to a back side of the capacitive sensor array;
    a chip including:
        active detection circuitry; and
        electrical connection points, wherein the electrical connection points of the chip are respectively connected to corresponding ones of the sensor cell circuitry connection points to form an electrical path therebetween;
    a cover plate positioned above the multiple sensor cells, wherein a spacing from a bottom side of the cover plate to the multiple sensor cells is less than 25 μm; and
    an interposer located between the capacitive sensor array and the chip, wherein the interposer comprises:
        rerouting traces disposed on at least one of a top or a bottom surface of the interposer; and
        a plurality of though vias;
        wherein at least some of the plurality of though vias are connected to at least some of the though-chip vias of the capacitive sensor array by the rerouting traces and at least some of the plurality of through vias are not aligned with their corresponding though-chip vias.

2. The fingerprint sensor of claim 1, further comprising a spacer located between the cover plate and the interposer.

3. The fingerprint sensor of claim 1, wherein the electrically conductive, through-chip vias comprise at least one of an annular via, a backside via, a coaxial via, or a triaxial via.

4. The fingerprint sensor of claim 1, wherein at least some of the electrically conductive, through-chip vias are located near a peripheral edge of the fingerprint sensor.

5. The fingerprint sensor of claim 1, wherein at least some of the electrically conductive, through-chip vias are located somewhere other than near a peripheral edge of the fingerprint sensor.

6. The fingerprint sensor of claim 1, wherein the capacitive sensor array is configured to send data to the active detection circuitry, and wherein the data are indicative of the presence of ridges and valleys when a finger is brought into contact with the cover plate.

7. The fingerprint sensor of claim 1, further comprising a standoff configured to separate the cover plate from the capacitive sensor array.

8. The fingerprint sensor of claim 1, wherein the spacing from the bottom side of the cover plate to the multiple sensor cells is less than 10 μm.

9. The fingerprint sensor of claim 1, wherein the rerouting traces are arranged substantially orthogonal to the non-aligned through vias.

10. The fingerprint sensor of claim 1, wherein the spacing from the bottom side of the cover plate to the multiple sensor cells is larger than 0.

11. The fingerprint sensor of claim 10, wherein the spacing from the bottom side of the cover plate to the multiple sensor cells is determined by at least one of a thickness of an adhesive or a flexure of the cover plate during use.

12. A fingerprint sensor, comprising:
    a first chip including a capacitive sensor array, wherein the capacitive sensor array includes:
        a plurality of sensor cells;
        sensor cell circuitry having a plurality of sensor connection points; and
        a plurality of electrically conductive, through-chip vias extending from the sensor connection points to a back side of the first chip;
    a second chip including active detection circuitry having a plurality of detection circuitry connection points respectively connected to corresponding ones of the sensor connection points to form electrical paths therebetween;
    an interposer layer located between the first chip and the second chip; and
    a cover plate positioned above, and separate from, the first chip, wherein a spacing from a bottom side of the cover plate to the first chip is less than 25 μm but larger than 0;
    wherein the interposer comprises:
        rerouting traces disposed on at least one of a top or a bottom surface of the interposer; and
        a plurality of through vias that are not aligned with the through-chip vias of the capacitive sensor array;
        wherein the rerouting traces connect the through vias of the interposer to corresponding through-chip vias of the capacitive sensor.

13. The fingerprint sensor of claim 12, wherein the spacing is determined by at least one of a thickness of an adhesive or a flexure of the cover plate during use.

14. The fingerprint sensor of claim 12, further comprising a spacer located between the cover plate and the interposer.

* * * * *

UNITED STATES PATENT AND TRADEMARK OFFICE
CERTIFICATE OF CORRECTION

| | | |
|---|---|---|
| PATENT NO. | : 7,705,613 B2 | Page 1 of 1 |
| APPLICATION NO. | : 11/619482 | |
| DATED | : April 27, 2010 | |
| INVENTOR(S) | : Misra et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 289 days.

Signed and Sealed this

Twenty-sixth Day of October, 2010

David J. Kappos
*Director of the United States Patent and Trademark Office*

UNITED STATES PATENT AND TRADEMARK OFFICE
CERTIFICATE OF CORRECTION

PATENT NO. : 7,705,613 B2  Page 1 of 1
APPLICATION NO. : 11/619482
DATED : April 27, 2010
INVENTOR(S) : Abhay Misra and John Trezza It is certified that error appears in the above-identified patent and that said Letters Patent is hereby corrected as shown below:

Claim 1, Column 7, Line 20:
Delete the word "though-chip" and replace with the word "through-chip"

Claim 1, Column 7, Line 37:
Delete the word "though" and replace with the word "through"

Claim 1, Column 7, Line 38:
Delete the word "though" and replace with the word "through"

Claim 1, Column 7, Line 42
Delete the word "though-chip" and replace with the word "through-chip"

Claim 1, Column 7, Line 39:
Delete the word "though-chip" and replace with the word "through-chip"

Signed and Sealed this

Twenty-first Day of December, 2010

David J. Kappos
*Director of the United States Patent and Trademark Office*